US008343580B2

(12) United States Patent
Wang et al.

(10) Patent No.: US 8,343,580 B2
(45) Date of Patent: Jan. 1, 2013

(54) ORGANOMETALLIC COMPOUNDS

(75) Inventors: Qing Min Wang, North Andover, MA (US); Deodatta Vinayak Shenai-Khatkhate, Danvers, MA (US); Huazhi Li, Somerville, MA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 303 days.

(21) Appl. No.: 12/881,896

(22) Filed: Sep. 14, 2010

(65) Prior Publication Data

US 2011/0064879 A1 Mar. 17, 2011

Related U.S. Application Data

(60) Provisional application No. 61/276,577, filed on Sep. 14, 2009.

(51) Int. Cl.
*C23C 16/18* (2006.01)
*C23C 18/44* (2006.01)

(52) U.S. Cl. ........... 427/248.1; 427/255.28; 427/255.31; 106/1.21; 106/1.28; 556/136

(58) Field of Classification Search ............... 427/248.1, 427/255.28, 255.31; 106/1.21, 1.28; 524/90, 524/154; 556/18, 20, 112, 117, 136; 564/15
See application file for complete search history.

(56) References Cited

U.S. PATENT DOCUMENTS

| | | | | |
|---|---|---|---|---|
| 5,464,656 | A * | 11/1995 | Verkade | 427/248.1 |
| 6,159,855 | A * | 12/2000 | Vaartstra | 438/681 |
| 6,350,686 | B1 * | 2/2002 | Vaartstra | 438/681 |
| 6,420,582 | B1 * | 7/2002 | Okamoto | 556/136 |
| 7,002,032 | B2 * | 2/2006 | Saito | 556/136 |
| 7,531,458 | B2 * | 5/2009 | Shenai-Khatkhate et al. | 438/681 |
| 7,547,631 | B2 * | 6/2009 | Shenai-Khatkhate et al. | 438/680 |
| 8,012,536 | B2 * | 9/2011 | Shenai-Khatkhate et al. | 427/250 |
| 2004/0204521 | A1 | 10/2004 | Camenzind et al. | |
| 2004/0241321 | A1 | 12/2004 | Ganguli et al. | |
| 2006/0110930 | A1 | 5/2006 | Senzaki | |
| 2008/0107812 | A1 | 5/2008 | Dussarrat et al. | |
| 2009/0199739 | A1 * | 8/2009 | Thompson et al. | 106/287.18 |
| 2009/0205538 | A1 * | 8/2009 | Thompson et al. | 106/287.18 |
| 2009/0205968 | A1 * | 8/2009 | Thompson et al. | 205/183 |
| 2009/0208670 | A1 * | 8/2009 | Thompson et al. | 427/569 |
| 2009/0209777 | A1 * | 8/2009 | Thompson et al. | 556/136 |

FOREIGN PATENT DOCUMENTS

| | | |
|---|---|---|
| EP | 1 293 509 | 9/2002 |
| EP | 2 000 561 | 12/2008 |
| WO | WO 2005/020317 | 3/2005 |
| WO | WO 2009/094263 | 7/2009 |
| WO | WO 2009/105668 | 8/2009 |

OTHER PUBLICATIONS

Cowley, Alan H., et al., "Organometallic Chemical Vapor Deposition of III/V Compound Semiconductors with Novel Organometallic Precursors." J. Am. Chem. Soc. 1988, 110, pp. 6248-6249.*
Meng, Guangyao, et al., "Model for the vaporization of mixed organometallic compounds in the metalorganic chemical vapor deposition of high temperature superconducting films". Appl. Phys. Lett. 63 (14), Oct. 4, 1993, pp. 1981-1983.*
Podall, H.E., et al, "The use of organometallic compounds in chemical vapor deposition". Annals of the New York Academy of Sciences, vol. 125, Issue 1, Dec. 16, 2006, pp. 218-228.*
European Search Report of corresponding European Application No. 10 17 6294.
Georg Suss-Fink, et al, "Chiral modification of trinuclear ruthenium clusters with proline and cysteine derivates. Synthesis, crystal structure, and catalytic properties of $[(\mu_2H)Ru_2(CO)_{10}\cdot[(\mu_{2,\eta}{}^2\text{-}OCNCH_2CH_2CH_2CHCH_2OCH_3)]$ and $[(\mu_2H)Ru_3(CO)_3(\mu_{3,\eta}{}^2\text{-}N=CCH_2CH_2CHCH_2OCH_3)]$", J. of Organometallic Chemistry, 379 (1989), pp. 311-323.
Fumiyuki Ozawa, et al, "Reactions of acyl(carbonyl)ruthenium(II) and acyl(carbonyl)iron(II) complexes with amines. Preparation of novel propionyl(carbamoyl) ruthenium (II) complexes", J of Organometallic Chemistry, 424 (1992) pp. 173-183.
Matsui Nonoyama, "Ruthenium(II) Complexes Derived from 2-(methylamino)pyridine", Inorganica Chimica Acta, 115 (1998) pp. 169-172.
Jerry D. Gargulak, et al, "Homogoeneous catalytic carbonylation of mitroaromatics, 6, Synthesis and structure of two bis(carbamoyl) complexes of ruthenium", Inorg. Chem. 1994, 333, pp. 253-257.
Robert J. Angelici, et al, "Kinetic and equillibrium studies of carbamoyl complex formation from manganese and rhenium carbonyls", Inorganic Chemistry, 1973, 12(5), pp. 1067-1071.
Sujit Dutta, et al, "Synthesis, structure and redox properties of mixed ligand complexes of trivalent ruthenium with deprotonated 2-carbamoylpyridine derivatives and 2.2'-bipyridine", Polyhedron 20, (2001), pp. 2027-2032.
Sujit Dutta, et al, "Synthesis and substitution reactions of dichiorobis-triphenylphosphine[2-(N-(2-pyridinium-2-yl)-carbamoyl-N')-pyridine]ruthenium(II)", Polyhedron 20 (2001) pp. 1815-1820.
S. Cenini, et al, "Low Oxidation State Ruthenium Chemistry", J Organometallic Chemistry, 125 (1977) pp. 95-108.
Beatrice Vendemiati, et al, "Paramagnetic Bis(amidinate) Iron(II) Complexes and their Diamagnetic Dicarbonyl Derivatives", Eur. J. Inorg. Chem. 2001, pp. 707-711.
Hubertus Wagner, et al, "The Crystal Structure of $\eta^5\text{-}C_5H_5Ru(CO)_2(CONH_2)$", Z. Naturforsch, 34b (1979), pp. 1487-1490.
Anton Junbauer et al, "About New Carbamoyl Carbonyl Complexes of Iron, Ruthenium and Osmium", Z. Naturiorsch, 34b (1979), pp. 1641-1645.
Huazhi et al. "Vapor deposition of ruthenium from an amidinate precursor", Journal of the Electrochmical Society, vol. 154, No. 12, Oct. 11, 2007, pp. D642-D647.
Huazhi et al, "Synthesis and characterization of ruthenium amidinate complexes as precursors for vapor deposition", The open Inorganic Chemistry Journal, vol. 2, 2008, pp. 11-17.

* cited by examiner

*Primary Examiner* — Bret Chen
(74) *Attorney, Agent, or Firm* — S. Matthew Cairns

(57) ABSTRACT

Methods of vapor depositing metal-containing films using certain organometallic compounds containing a carbonyl-containing ligand are disclosed.

14 Claims, No Drawings

ORGANOMETALLIC COMPOUNDS

This application claims the benefit of priority under 35 U.S.C. §119(e) to U.S. Provisional Application No. 61/276,577, filed Sep. 14, 2009, the entire contents of which application are incorporated herein by reference.

The present invention relates generally to the field of organometallic compounds. In particular, the present invention relates to the field of organometallic compounds useful for vapor deposition of thin films.

Vapor deposition techniques, such as chemical vapor deposition ("CVD"), are used to deposit thin films on a substrate. In such techniques, a reactant (or precursor) is conveyed in a gaseous (or vapor) phase from a source to a deposition reactor containing a substrate. Metalorganic chemical vapor deposition ("MOCVD") is one technique where a metal-containing layer is deposited by decomposing an organometallic precursor compound at elevated temperatures, that is, above room temperature, either at atmospheric or reduced pressure. Atomic layer deposition ("ALD") is another technique where conformal thin films are deposited by exposing a surface to alternating vapors of two or more chemical reactants, in contrast to MOCVD processes where the chemical reactant vapors are provided at the same time. In ALD, the vapor from a first precursor (or reactant) is brought to a surface onto which the desired thin film is to be deposited. Any unreacted vapor is then removed from the system under vacuum. Next, vapor from a second precursor is brought to the surface and allowed to react with the first precursor, with any excess second precursor vapor being removed. Each step in ALD is a self-limiting process used to deposit thin films one atomic layer at a time. This sequence of steps is repeated until the desired film thickness is obtained. ALD processes are generally performed at fairly low temperatures, such as from 200 to 400° C. The exact temperature range will depend on the particular film to be deposited as well as on the particular precursors employed. ALD processes have been used to deposit pure metals as well as metal oxides, metal nitrides, metal carbide nitrides, and metal silicide nitrides.

CVD precursors, including ALD precursors, must be sufficiently volatile to ensure a sufficient concentration of the precursor vapor in the reactor to deposit a film layer on the substrate surface within a reasonable period of time. The precursors must also be sufficiently stable to be vaporized without premature decomposition and unwanted side reactions, but must also be sufficiently reactive to form the desired film on the substrate. With such a required balance of volatility and stability properties, a wide variety of organometallic precursors have been proposed.

Conventional precursors are homoleptic, that is, they have a single ligand group around a central atom. Homoleptic precursors offer uniform chemical characteristics, thus offering the inherent advantage of matching and harmonizing the functionality of ligand with the deposition process. For example, WO 2004/46417 (Gordon et al.) discloses certain homoleptic amidinate compounds as suitable precursors for ALD. However, the use of only a single ligand group offers less control over other paramount precursor characteristics, such as the shielding of the metal center, that governs the surface reactions and gas phase reactions (for example, reaction of a first precursor with second complementary precursor), adjusting the volatility of the precursor, and achieving required thermal stability for the precursor. Heteroleptic precursors, that is, precursors having two or more different ligand groups around a metal center, have also been reported. However, the market has not yet settled on the most suitable type of precursor that provides the right balance of volatility, thermal stability and electrical performance and there continues to be a need for suitable organometallic precursors that meet these needs.

CVD processes may utilize non-conventional delivery techniques such as direct liquid injection ("DLI") or be modified to incorporate atomized spray techniques as in atomic vapor deposition. In DLI processes, the desired precursor is dissolved in a suitable solvent, and the solution is then pumped in precise amounts to a vaporizer and the vapor is then conveyed to a deposition reactor, where the vaporized precursor is then decomposed to provide a film on a substrate. The increased molecular complexity and greater steric bulk of new precursors has greatly reduced their solubility in organic solvents, thereby limiting the applications of such precursors in vapor depositions. Thus, there remains a need for suitable organic solvent-soluble precursors that fulfill the requirements of DLI delivery techniques.

The present invention provides a method of depositing a metal-containing film including: providing a substrate in a vapor deposition reactor; conveying an organometallic compound of the formula $[R^2R^1X(CO)]_n M^{+m} L^1_{(m-n)/p} L^2_q$ in the vapor phase to the reactor; and decomposing the organometallic compound to deposit a metal-containing film on the substrate; wherein $R^1$ and $R^2$ are independently chosen from H, ($C_1$-$C_{12}$)alkyl, ($C_2$-$C_{12}$)alkenyl, ($C_2$-$C_{12}$)alkynyl, di($C_1$-$C_{12}$)alkylamino, di(silyl($C_1$-$C_{12}$)alkyl)amino, disilylamino, di(($C_1$-$C_{12}$)alkylsilyl)amino, ($C_1$-$C_{12}$)alkyliminyl, ($C_1$-$C_{12}$)alkylphosphinyl, di($C_1$-$C_{12}$)alkylamino($C_1$-$C_{12}$)alkyl, di($C_1$-$C_{12}$)alkylamino($C_2$-$C_{12}$)alkenyl, di($C_1$-$C_{12}$)alkylamino($C_2$-$C_{12}$)alkynyl, di($C_1$-$C_{12}$)alkylphosphino($C_1$-$C_{12}$)alkyl, di($C_1$-$C_{12}$)alkylphosphino ($C_2$-$C_{12}$)alkenyl, di($C_1$-$C_{12}$)alkylphosphino($C_2$-$C_{12}$)alkynyl, ($C_1$-$C_{12}$)alkoxyl($C_1$-$C_{12}$)alkyl, and aryl; X=N or P; M=a Group 7 to Group 10 metal; $L^1$=an anionic ligand bearing a negative charge of p; $L^2$=a neutral ligand; m=the valence of M; n=1-6; p=1-2; q=0-4; and wherein m≧n. The organometallic compounds of the present invention are more soluble in typical organic solvents used in DLI techniques than are many conventional precursors for use in ALD, such as amidinate compounds.

The present invention also provides organometallic compounds of the formula $[R^2R^1P(CO)]_n M^{+m} L^1_{(m-n)/p} L^2_q$; wherein $R^1$ and $R^2$ are independently chosen from H, ($C_1$-$C_{12}$)alkyl, ($C_2$-$C_{12}$)alkenyl, ($C_2$-$C_{12}$)alkynyl, di($C_1$-$C_{12}$)alkylamino, di(silyl($C_1$-$C_{12}$)alkyl)amino, disilylamino, di(($C_1$-$C_{12}$)alkylsilyl)amino, ($C_1$-$C_{12}$)alkyliminyl, ($C_1$-$C_{12}$)alkylphosphinyl, di($C_1$-$C_{12}$)alkylamino($C_1$-$C_{12}$)alkyl, di($C_1$-$C_{12}$)alkylamino($C_2$-$C_{12}$)alkenyl, di($C_1$-$C_{12}$)alkylamino($C_2$-$C_{12}$)alkynyl, di($C_1$-$C_{12}$)alkylphosphino ($C_1$-$C_{12}$)alkyl, di($C_1$-$C_{12}$)alkylphosphino($C_2$-$C_{12}$)alkenyl, di($C_1$-$C_{12}$)alkylphosphino($C_2$-$C_{12}$)alkynyl, ($C_1$-$C_{12}$)alkoxyl($C_1$-$C_{12}$)alkyl, and aryl; M=a Group 7 to Group 10 metal; $L^1$=an anionic ligand bearing a negative charge of p; $L^2$=a neutral ligand; m=the valence of M; n=1-6; p=1-2; q=0-4; and wherein m≧n.

As used herein, the following abbreviations shall have the following meanings, unless the context clearly indicates otherwise: ° C.=degrees Celsius; NMR=nuclear magnetic resonance; TGA=thermogravimetric analysis; ICP-MS=inductively coupled plasma-mass spectrometry; b.p.=boiling point; g=gram; v/v=volume to volume; L=liter; ca.=approximately; s=seconds; nm=nanometer; Å=angstrom; sccm=standard cubic centimeter per minute; M=molar; and mL=milliliter. Unless otherwise noted, all amounts are percent by weight and all ratios are molar ratios. All numerical ranges are inclusive and combinable in any order except where it is obvious that such numerical ranges are constrained to add up to 100%. The articles "a" and "an" refer to the singular and the plural.

The term "alkyl" includes straight chain, branched and cyclic alkyl. Likewise, the terms "alkenyl" and "alkynyl" include straight chain, branched and cyclic alkenyl and alkynyl, respectively. The term "alkene" includes any compound having one or more olefinic linkages, such as dienes and trienes. The term "alkyne", includes compounds having one or more acetylenic linkages, such as diynes and triynes. "Halogen" refers to fluorine, chlorine, bromine and iodine and "halo" refers to fluoro, chloro, bromo and iodo. As used herein, "aryl" refers to an aromatic hydrocarbon radical. Each of the alkyl, alkenyl, alkynyl and aryl groups may optionally may have one or more of its hydrogens replaced with a substituent group such as, but not limited to, $(C_1-C_6)$alkyl, $(C_2-C_6)$alkenyl, $(C_1-C_6)$alkoxy, and halo.

The organometallic compounds useful in the present invention are those having the formula $[R^2R^1X(CO)]_n M^{+m} L^1_{(m-n)/p} L^2_q$ wherein $R^1$ and $R^2$ are independently chosen from H, $(C_1-C_{12})$alkyl, $(C_2-C_{12})$alkenyl, $(C_2-C_{12})$alkynyl, $di(C_1-C_{12})$alkylamino, $di(silyl(C_1-C_{12})alkyl)$amino, disilylamino, $di((C_1-C_{12})alkylsilyl)$amino, $(C_1-C_{12})$alkyliminyl, $(C_1-C_{12})$alkylphosphinyl, $di(C_1-C_{12})$alkylamino$(C_1-C_{12})$alkyl, $di(C_1-C_{12})$alkylamino$(C_2-C_{12})$alkenyl, $di(C_1-C_{12})$alkylamino$(C_2-C_{12})$alkynyl, $di(C_1-C_{12})$alkylphosphino$(C_1-C_{12})$alkyl, $di(C_1-C_{12})$alkylphosphino$(C_2-C_{12})$alkenyl, $di(C_1-C_{12})$alkylphosphino$(C_2-C_{12})$alkynyl, $(C_1-C_{12})$alkoxyl$(C_1-C_{12})$alkyl, and aryl; X=N or P; M=a Group 7 to Group 10 metal; $L^1$=an anionic ligand bearing a negative charge of p; $L^2$=a neutral ligand; m=the valence of M; n=1-6; p=1-2; q=0-4; and wherein m≧n. The present organometallic compounds contain one or more carbonyl-containing ligands of the formula $R^2R^1X(CO)$ wherein $R^1$, $R^2$ and X are as described above. The subscript "n" represents the number of the carbonyl-containing ligands in the present organometallic compounds. Preferably, n=1-5, more preferably n=1-4, still more preferably n=1-3. When m=n, the organometallic compound is homoleptic, that is, the carbonyl-containing ligand is the only ligand present in the organometallic compound, although neutral ligands may be present. A wide variety of metals may suitably be used to form the present organometallic compounds. Preferably, M=Mn, Tc, Re, Fe, Ru, Os, Co, Rh, Ir, Ni, Pd, or Pt. More preferably, M is chosen from a Group 8 to Group 10 metal. Still more preferably, M is a Group 8 metal. Even more preferably, M=Co, Ni, Ru, Rh, Pd, Ir or Pt, and most preferably M=Ru.

In the present organometallic compounds, preferably, $R^1$ and $R^2$ are independently chosen from H, $(C_1-C_6)$alkyl, $(C_2-C_6)$alkenyl, $(C_2-C_6)$alkynyl, $(C_2-C_{10})$alkyliminyl, $(C_2-C_{10})$alkylphosphinyl, $di(C_1-C_6)$alkylamino$(C_1-C_{12})$alkyl, $di(C_1-C_{12})$alkylamino$(C_2-C_{12})$alkenyl, $di(C_1-C_{12})$alkylamino$(C_2-C_{12})$alkynyl, $di(C_1-C_6)$alkylphosphino$(C_1-C_{12})$alkyl, $di(C_1-C_6)$alkylphosphino$(C_2-C_{12})$alkenyl, $di(C_1-C_6)$alkylphosphino$(C_2-C_{12})$alkynyl, $(C_1-C_6)$alkoxyl$(C_1-C_{12})$alkyl, and aryl. More preferably, $R^1$ and $R^2$ are independently chosen from H, $(C_1-C_6)$alkyl, $(C_2-C_6)$alkenyl, $(C_2-C_6)$alkynyl, $(C_1-C_6)$alkyliminyl, $(C_1-C_6)$alkylphosphinyl, $di(C_1-C_6)$alkylamino$(C_1-C_6)$alkyl, $di(C_1-C_6)$alkylamino$(C_2-C_6)$alkenyl, $di(C_1-C_6)$alkylamino$(C_2-C_6)$alkynyl, $di(C_1-C_6)$alkylphosphino$(C_1-C_6)$alkyl, $di(C_1-C_6)$alkylphosphino$(C_2-C_6)$alkenyl, $di(C_1-C_6)$alkylphosphino$(C_2-C_6)$alkynyl, $(C_1-C_6)$alkoxyl$(C_1-C_6)$alkyl, and aryl. Even more preferably, $R^1$ and $R^2$ are independently chosen from H, $(C_1-C_6)$alkyl, $(C_2-C_6)$alkenyl, $(C_2-C_{10})$alkyliminyl, $(C_2-C_{10})$alkylphosphinyl, $di(C_1-C_6)$alkylamino$(C_1-C_6)$alkyl, $di(C_1-C_6)$alkylphosphino$(C_1-C_6)$alkyl, $(C_1-C_6)$alkoxyl$(C_1-C_6)$alkyl, and aryl.

Exemplary $(C_1-C_{12})$alkyl groups include, without limitation, methyl, ethyl, n-propyl, iso-propyl, n-butyl, sec-butyl, tert-butyl, pentyl, hexyl, cyclopropyl, cyclopentyl, methylcyclopentyl, dimethylcyclopentyl, cyclohexyl, methylcyclohexyl and dimethylcyclohexyl. Preferred $(C_1-C_{12})$alkyl groups are methyl, ethyl, n-propyl, iso-propyl, n-butyl, sec-butyl, tert-butyl, pentyl, hexyl, cyclopropyl, cyclopentyl, methyl cyclopentyl and cyclohexyl. Exemplary $(C_2-C_{12})$alkenyl groups include ethenyl, allyl, butenyl, cyclopentenyl, cyclopentadienyl, methylcyclopentadienyl, pentamethylcyclopentadienyl, cyclohexenyl, methylcyclohexenyl, and cyclooctadienyl. Preferred $(C_2-C_{12})$alkenyl are ethenyl, allyl, butenyl, cyclopentenyl, cyclopentadienyl, and methylcyclopentadienyl. Suitable $(C_2-C_{12})$alkynyl groups include, without limitation, acetylenyl and propynyl. Suitable $di(C_1-C_{12})$alkylamino$(C_1-C_{12})$alkyl groups include dimethylaminomethyl, dimethylaminoethyl, dimethylaminopropyl, diethylaminomethyl, diethylaminoethyl, diethylaminopropyl, ethylmethylaminoethyl, and ethylaminopropyl. Exemplary $di(C_1-C_{12})$alkylphosphino$(C_1-C_{12})$alkyl groups include, but are not limited to, dimethylphosphinomethyl, dimethylphosphinoethyl, dimethylphosphinopropyl, dimethylphosphinobutyl, diethylphosphinomethyl, diethylphosphinopropyl, diethylphosphinobutyl, dipropylphosphinoethyl, dipropylphosphinopropyl, ethylmethylphosphinomethyl, ethylmethylphosphinoethyl, and ethylmethylphosphinopropyl. Suitable $di(C_1-C_{12})$alkylamino$(C_2-C_{12})$alkenyl groups include, without limitation, dimethylallyl, diethylallyl, and ethylmethylallyl. Exemplary $(C_1-C_{12})$alkoxyl$(C_1-C_{12})$alkyl groups include, but are not limited to, methoxymethyl, methoxyethyl, methoxypropyl, methoxybutyl, dimethoxyethyl, dimethoxypropyl, ethoxymethyl, ethoxyethyl, ethoxypropyl, propoxyethyl, propoxypropyl, propoxybutyl, dimethyoxypentyl, and diethoxypentyl. Suitable aryl groups include $(C_6-C_{18})$aryl, and preferably $(C_6-C_{12})$aryl. As used herein, the term "aryl" includes aralkyl, such as $ar(C_1-C_6)$alkyl. Exemplary aryl groups include, without limitation, phenyl, benzyl, phenethyl, tolyl, xylyl, ethylphenyl, iso-propylphenyl, ethyl-methyl-phenyl, diethylphenyl, and naphthyl. Preferred aryl groups are phenyl, tolyl, xylyl, naphthyl, benzyl, and phenethyl.

In a preferred embodiment, at least one of $R^1$ and $R^2$ is a group that contains an atom capable of coordinating with the metal, such as O, N and P, and more preferably N or P. Suitable groups for $R^1$ and $R^2$ that contain a metal-coordinating atom include $(C_1-C_{12})$alkyliminyl, $(C_1-C_{12})$alkylphosphinyl, $di(C_1-C_{12})$alkylamino$(C_1-C_{12})$alkyl, $di(C_1-C_{12})$alkylamino$(C_2-C_{12})$alkenyl, $di(C_1-C_{12})$alkylamino$(C_2-C_{12})$alkynyl, $di(C_1-C_{12})$alkylphosphino$(C_1-C_{12})$alkyl, $di(C_1-C_{12})$alkylphosphino$(C_2-C_{12})$alkenyl, $di(C_1-C_{12})$alkylphosphino$(C_2-C_{12})$alkynyl and $(C_1-C_{12})$alkoxyl$(C_1-C_{12})$alkyl. Preferable metal-coordinating atom containing groups for $R^1$ and $R^2$ include $(C_2-C_{10})$alkyliminyl, $(C_2-C_{10})$alkylphosphinyl, $di(C_1-C_6)$alkylamino$(C_1-C_{12})$alkyl, $di(C_1-C_{12})$alkylamino$(C_2-C_{12})$alkenyl, $di(C_1-C_{12})$alkylamino$(C_2-C_{12})$alkynyl, $di(C_1-C_6)$alkylphosphino$(C_1-C_{12})$alkyl, $di(C_1-C_6)$alkylphosphino$(C_2-C_{12})$alkenyl, $di(C_1-C_6)$alkylphosphino$(C_2-C_{12})$alkynyl and $(C_1-C_6)$alkoxyl$(C_1-C_{12})$alkyl. It is further preferred that at least one of $R^1$ and $R^2$ contains a metal-coordinating atom and that when taken together with the metal form a 5 to 7-membered ring, such as that shown in the following formula:

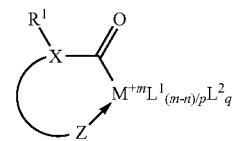

wherein M, X, $R^1$, $L^1$, $L^2$, m, n, p and q are as defined above, Z is chosen from $OR^3$, $NR^3R^4$ and $PR^3R^4$, and each of $R^3$ and $R^4$ are independently selected from hydrogen and $(C_1-C_{12})$ alkyl. Preferably, $R^3$ and $R^4$ are independently selected from hydrogen and $(C_1-C_6)$alkyl. When Z is N or P, $R^3$ and $R^4$ may be taken together, along with the atom to which they are attached, to form a 5- to 10-membered ring, such as that shown in the following formula containing a bicyclic amidinate group

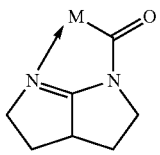

wherein M is as described above.

When at least one of $R^1$ and $R^2$ is chosen from $(C_1-C_{12})$ alkyliminyl and $(C_1-C_{12})$alkylphosphinyl groups, such carbonyl-containing ligand has the general formula:

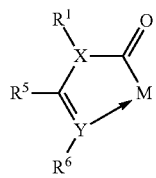

wherein X, M and $R^1$ are as defined above, $R^5$ is chosen from H, $(C_1-C_{12})$alkyl, $(C_2-C_{12})$alkenyl, $(C_2-C_{12})$alkynyl, dialkylamino, di(silylalkyl)amino, disilylamino, di(alkylsilyl) amino, and aryl; $R^6$ is chosen from H, $(C_1-C_{12})$alkyl, $(C_2-C_{12})$ alkenyl, $(C_2-C_{12})$alkynyl, and aryl; and Y is chosen from N (an alkyliminyl group) and P (an alkylphosphinyl group). Preferably, $R^5$ is chosen from H, $(C_1-C_6)$alkyl, $(C_2-C_6)$alkenyl, $(C_2-C_6)$alkynyl, di$(C_1-C_6)$alkylamino, di(silylalkyl) amino, disilylamino, di$((C_1-C_6)$alkylsilyl)amino, and $(C_6-C_{12})$aryl. Preferably, $R^6$ is chosen from H, $(C_1-C_6)$alkyl, $(C_2-C_6)$alkenyl, $(C_2-C_6)$alkynyl, and $(C_6-C_{12})$aryl. Suitable $(C_1-C_{12})$alkyliminyl and $(C_1-C_{12})$alkylphosphinyl groups include, without limitation, amidinates, formamidinates, phosphoamidinates, guanidinates, β-diketiminates, bicyclic amidinates and bicyclic guanidinates.

The present invention also provides organometallic compounds of the formula $[R^2R^1P(CO)]_n M^{+m} L^1_{(m-n)/p} L^2_q$; wherein $R^1$ and $R^2$ are independently chosen from H, $(C_1-C_{12})$alkyl, $(C_2-C_{12})$alkenyl, $(C_2-C_{12})$alkynyl, di$(C_1-C_{12})$ alkylamino, di(silyl$(C_1-C_{12})$alkyl)amino, disilylamino, di$((C_1-C_{12})$alkylsilyl)amino, $(C_1-C_{12})$alkyliminyl, $(C_1-C_{12})$ alkylphosphinyl, di$(C_1-C_{12})$alkylamino$(C_1-C_{12})$alkyl, di$(C_1-C_{12})$alkylamino$(C_2-C_{12})$alkenyl, di$(C_1-C_{12})$alkylamino$(C_2-C_{12})$alkynyl, di$(C_1-C_{12})$alkylphosphino$(C_1-C_{12})$alkyl, di$(C_1-C_{12})$alkylphosphino$(C_2-C_{12})$alkenyl, di$(C_1-C_{12})$ alkylphosphino$(C_2-C_{12})$alkynyl, $(C_1-C_{12})$alkoxyl$(C_1-C_{12})$ alkyl, and aryl; wherein M, $L^1$, $L^2$, m, n, p, and q are as defined above; and wherein m≧n. Preferably, $R^1$ and $R^2$ are independently chosen from H, $(C_1-C_6)$alkyl, $(C_2-C_6)$alkenyl, $(C_2-C_6)$ alkynyl, $(C_2-C_{10})$alkyliminyl, $(C_2-C_{10})$alkylphosphinyl, di$(C_1-C_6)$alkylamino$(C_1-C_{12})$alkyl, di$(C_1-C_{12})$alkylamino $(C_2-C_{12})$alkenyl, di$(C_1-C_{12})$alkylamino$(C_2-C_{12})$alkynyl, di$(C_1-C_6)$alkylphosphino$(C_1-C_{12})$alkyl, di$(C_1-C_6)$alkylphosphino$(C_2-C_{12})$alkenyl, di$(C_1-C_6)$alkylphosphino$(C_2-C_{12})$alkynyl, $(C_1-C_6)$alkoxyl$(C_1-C_{12})$alkyl, and aryl. More preferably, $R^1$ and $R^2$ are independently chosen from H, $(C_1-C_6)$alkyl, $(C_2-C_6)$alkenyl, $(C_2-C_6)$alkynyl, $(C_1-C_6)$alkyliminyl, $(C_1-C_6)$alkylphosphinyl, di$(C_1-C_6)$alkylamino$(C_1-C_6)$ alkyl, di$(C_1-C_6)$alkylamino$(C_2-C_6)$alkenyl, di$(C_1-C_6)$ alkylamino$(C_2-C_6)$alkynyl, di$(C_1-C_6)$alkylphosphino$(C_1-C_6)$alkyl, di$(C_1-C_6)$alkylphosphino$(C_2-C_6)$alkenyl, di$(C_1-C_6)$alkylphosphino$(C_2-C_6)$alkynyl, $(C_1-C_6)$alkoxyl$(C_1-C_6)$ alkyl, and aryl. Even more preferably, $R^1$ and $R^2$ are independently chosen from H, $(C_1-C_6)$alkyl, $(C_2-C_6)$alkenyl, $(C_2-C_{10})$alkyliminyl, $(C_2-C_{10})$alkylphosphinyl, di$(C_1-C_6)$ alkylamino$(C_1-C_6)$alkyl, di$(C_1-C_6)$alkylphosphino$(C_1-C_6)$ alkyl, $(C_1-C_6)$alkoxyl$(C_1-C_6)$alkyl, and aryl.

A wide variety of anionic ligands ($L^1$) may be used in the present organometallic compounds. Such anionic ligands bear one or two negative charges, and include, but are not limited to, hydride, halide, azide, alkyl, alkenyl, alkynyl, carbonyl, amino, alkylamino, dialkylamino, di(silylalkyl) amino, disilylamino, di(alkylsilyl)amino, imino, alkylimino, arylimino, dialkylaminoalkyl, hydrazido, phosphido, alkylphosphido, arylphosphido, nitrosyl, nitryl, nitrate, nitrile, alkoxy, dialkylaminoalkoxy, alkoxyalkyldialkylamino, siloxy, diketonates, cyclopentadienyls, silyls, pyrazolates, amidinate, formamidinate, phosphoamidinate, guanidinates, β-diketonates, β-diketiminates, bicyclic amidinates, bicyclic guanidinates and bidentate ligands having at least two coordination sites chosen from N and O, including 1-methoxy-2-methyl-2-propoxide, dimethylaminoethoxide, dimethylamino iso-propoxide, alkoxyalkylaminoalkyl and alkylaminoalkoxy ligands. The anionic ligands may be optionally substituted such as by replacing one or more hydrogens with another substituent group such as halo, amino, disilylamino and silyl.

Exemplary anionic ligands include, but are not limited to: $(C_1-C_{12})$alkyl such as methyl, ethyl, propyl, butyl, pentyl, hexyl, cyclopropyl, cyclopentyl and cyclohexyl; $(C_2-C_{12})$alkenyl such as ethenyl, allyl, and butenyl; $(C_2-C_{12})$alkynyl such as acetylenyl and propynyl; $(C_1-C_{12})$alkoxy such as methoxy, ethoxy, propoxy, and butoxy; $(C_1-C_{12})$alkylamino such as methylamino, ethylamino and propylamino; di$(C_1-C_{12})$alkylamino such as dimethylamino, diethylamino, ethylmethylamino and dipropylamino; cyclopentadienyls such as cyclopentadienyl, methylcyclopentadienyl and pentamethylcyclopentadienyl; di$(C_1-C_{12})$alkylamino$(C_1-C_{12})$alkoxy such as dimethylaminoethoxy, diethylaminoethoxy, dimethylaminopropoxy, ethylmethylaminopropoxy and diethylaminopropoxy; silyls such as $(C_1-C_{12})$alkylsilyls and $(C_1-C_{12})$alkylaminosilyls; guanidinates such as tetramethylguanidinates and tetraethylguanidinates; and phosphoamidinates such as N,P-dimethyl-methylphosphoamidinato, N,P-diethyl-methylphosphoamidinato, N,P-diethyl-ethylphosphoamidinato, N,P-di-iso-propyl-methylphosphoamidinato, N,P-di-iso-propyl-iso-propylphosphoamidinato, and N,P-dimethyl-phenylphosphoamidinato. When two or more anionic ligands are present, such ligands may be the same or different.

The present organometallic compounds may optionally contain one or more neutral ligands ($L^2$). Such neutral ligands do not bear an overall charge. The neutral ligands may function as stabilizers. Neutral ligands include, without limitation, CO, NO, nitrogen, amines, ethers, phosphines, alkylphosphines, arylphosphines, nitriles, alkenes, dienes, trienes, alkynes, and aromatic compounds. Exemplary neutral ligands include, but are not limited to: $(C_2-C_{12})$alkenes such as ethene, propene, 1-butene, 2-butene, 1-pentene, 2-pentene, 1-hexene, 2-hexene, norbornene, vinylamine, allylamine, vinyltri$(C_1-C_{12})$alkylsilane, divinyldi$(C_1-C_{12})$ alkylsilane, vinyltri$(C_1-C_6)$alkoxysilane and divinyldi$(C_1$-

$C_{12}$)alkoxysilane; ($C_4$-$C_{12}$)dienes such as butadiene, cyclopentadiene, isoprene, hexadiene, octadiene, cyclooctadiene, norbornadiene and α-terpinene; ($C_6$-$C_{16}$)trienes; ($C_2$-$C_{12}$) alkynes such as acetylene and propyne; and aromatic compounds such as benzene, o-xylene, m-xylene, p-xylene, toluene, o-cymene, m-cymene, p-cymene, pyridine, furan and thiophene; ($C_2$-$C_{12}$)ethers such as tetrahydrofuran, dioxane, glymes (or glycol ethers). The number of neutral ligands depends upon the particular metal chosen for M. When two or more neutral ligands are present, such ligands may be the same or different.

The present organometallic compounds may be prepared by a variety of methods known in the literature. For example, metal carbamoyl compounds can be prepared by reacting the corresponding amine compounds with metal carbonyls. See, for example, Angelici et al., *Inorganic Chemistry*, Vol. 12, No. 5 (1973), pp 1067-1071; and M. Nonoyama, *Inorganica Chimica Acta*, 115 (1986), pp 169-172, which disclose the preparation of metal carbamoyl compounds. Likewise, the corresponding phosphines, $R^2R^1PH$, or its phosphide form, $R^2R^1PM'$ (M'=Li, Na, or K) can react with metal carbonyls to generate $R^2R^1P(CO)$-containing compounds.

One characteristic feature of the present organometallic compounds is the presence of a carbonyl-containing ligand as described above, such as a carbamoyl group or its phosphorus analog, where the carbonyl carbon is bonded to the metal center, such as through a σ- or π-bond. Inserting a carbonyl ("C=O") between the metal and a nitrogen or the metal and a phosphorus in the present organometallic compounds has been found to significantly enhance their volatility, thermal stability and solubility as compared to corresponding organometallic compounds containing a metal-nitrogen bond such as in amido, imido, dialkylamido, amidinato, pyrazolato, and beta-diketiminato organometallic compounds, or a metal-phosphorus bond such as in phosphino and dialkylphosphino organometallic compounds. For example, the solubility of the ruthenium carbamoyl compound N,N'-di-tert-butylacetamidinato-N,N'-di-tert-butylacetamidinatocarbamoyl dicarbonyl Ruthenium(II) ("Ru-Cbm") was found to be significantly greater than that of bis(N,N'-di-tert-N,N'-di-tert-butylacetamidinato)dicarbonyl Ruthenium(II) ("Ru-AMD"). The solubility of Ru-Cbm increased 62-fold in tetrahydrofuran as compared to Ru-AMD, and was soluble in aromatic solvents such as toluene and tetralin where Ru-AMD showed little to no solubility as determined by Nuclear Magnetic Resonance ("NMR") spectroscopy and by a direct dissolution method.

The present organometallic compounds are useful in depositing metal-containing films on a substrate by vapor deposition. Such compounds may be used in any suitable vapor deposition process, such as CVD and ALD. Suitable substrates are semiconductive substrates, which may include, but are not limited to, silicon, silicon germanium, silicon carbide, gallium nitride, gallium arsenide, and indium phosphide. Such substrates are particularly useful in the manufacture of integrated circuits, light emitting diodes and memory devices. In one embodiment, two or more of the present organometallic compounds may be used in a vapor deposition process, such as CVD or ALD. When two or more organometallic compounds are used, such compounds may contain the same metal but having different ligands, or may contain different metals. In another embodiment, one or more of the present organometallic compounds may be used with one or more other precursor compounds.

The present invention provides a method of depositing a metal-containing film including: providing a substrate in a vapor deposition reactor; conveying an organometallic compound of the formula $[R^2R^1X(CO)]_nM^{+m}L^1_{(m-n)/p}/L^2_q$ in the vapor phase to the reactor; and decomposing the organometallic compound to deposit a metal-containing film on the substrate; wherein $R^1$ and $R^2$ are independently chosen from H, ($C_1$-$C_{12}$)alkyl, ($C_2$-$C_{12}$)alkenyl, ($C_2$-$C_{12}$)alkynyl, di($C_1$-$C_{12}$)alkylamino, di(silyl($C_1$-$C_{12}$)alkyl)amino, disilylamino, di(($C_1$-$C_{12}$)alkylsilyl)amino, ($C_1$-$C_{12}$)alkyliminyl, ($C_1$-$C_{12}$)alkylphosphinyl, di($C_1$-$C_{12}$)alkylamino($C_1$-$C_{12}$)alkyl, di($C_1$-$C_{12}$)alkylamino($C_2$-$C_{12}$)alkenyl, di($C_1$-$C_{12}$)alkylamino($C_2$-$C_{12}$)alkynyl, di($C_1$-$C_{12}$)alkylphosphino($C_1$-$C_{12}$)alkyl, di($C_1$-$C_{12}$)alkylphosphino ($C_2$-$C_{12}$)alkenyl, di($C_1$-$C_{12}$)alkylphosphino($C_2$-$C_{12}$)alkynyl, ($C_1$-$C_{12}$)alkoxyl($C_1$-$C_{12}$) alkyl, and aryl; X=N or P; M=a Group 7 to Group 10 metal; $L^1$=an anionic ligand bearing a negative charge of p; $L^2$=a neutral ligand; m=the valence of M; n=1-6; p=1-2; q=0-4; and wherein m≧n.

In ALD processes, conformal thin films are deposited by exposing a surface of a substrate to alternating vapors of two or more chemical reactants (or precursors). The organometallic compounds described above are useful as a first precursor in ALD processes. The second precursor may be any suitable precursor that reacts with the first precursor to form the desired film. Such second precursors may optionally contain another metal. Exemplary second precursors include, but are not limited to, oxygen, ozone, water, peroxide, alcohols, nitrous oxide, ammonia, hydrogen, silane, dialkylsilane forming gas, and mixtures of any of these such as a mixture of ammonia and hydrogen. When used in an ALD process, the present invention also provides a method of depositing a metal-containing film on a substrate including the steps of: (a) providing a substrate in a reactor; (b) conveying a first precursor compound in a gaseous form to the reactor, wherein the first precursor compound is the organometallic compound described above; (c) chemisorbing the first precursor compound on a surface of the substrate; (d) removing any non-chemisorbed first precursor compound from the reactor; (e) conveying a second precursor in a gaseous form to the reactor; (f) reacting the first and second precursors to form a metal-containing film on the substrate; and removing any unreacted second precursor. The above steps (b)-(f) may be repeated any number of times to provide a metal-containing film of a desired thickness. The step of removing a precursor from the reactor may include one or more of evacuating the reactor under vacuum and purging the reactor using a non-reactant gas and/or solvent vapor.

Thin metal-containing films produced by ALD have almost perfect stoichiometry and are obtained by alternately subjecting the substrate, one at a time, to the vapor of precursor compounds of each of the elements of which the film is formed. In ALD processes, a substrate is subjected to the vapor of a first precursor which can react with the surface of the substrate at a temperature sufficiently high for such reaction to occur whereby a single atomic layer of the first precursor (or metal contained therein) is formed on the surface of the substrate, and subjecting the thus formed surface with the first precursor atomic layer thereon to the vapor of a second precursor which reacts with the first precursor at a temperature sufficiently high for such reaction to occur whereby a single atomic layer of the desired metal film is formed on the surface of the substrate. This procedure can be continued by alternately using the first and second precursors until the film that is formed reaches a desire to thickness. The temperatures used in such ALD processes are typically lower than those employed in MOCVD process and may be in the range of 150 to 400° C., although other suitable temperatures may be employed depending upon the precursors chosen, the film to be deposited, and on other criteria known to those skilled in the art.

Bubblers (also known as cylinders) are the typical delivery devices used to provide the present organometallic compounds in the vapor phase to a deposition reactor. Such bubblers typically contain a fill port, a gas inlet port and an outlet port which is connected to a deposition chamber. A carrier gas typically enters the bubbler through the gas inlet port and entrains or picks up precursor vapor. The entrained or carried vapor then exits the bubbler through the outlet port and is conveyed to the deposition chamber. A variety of carrier gases may be used, such as hydrogen, helium, nitrogen, argon and mixtures thereof.

A wide variety of bubblers may be used, depending upon the particular deposition apparatus used. When the precursor compound is a solid, the bubblers disclosed in U.S. Pat. Nos. 6,444,038 (Rangarajan et al.) and 6,607,785 (Timmons et al.), as well as other designs, may be used. For liquid precursor compounds, the bubblers disclosed in U.S. Pat. Nos. 4,506,815 (Melas et al.) and 5,755,885 (Mikoshiba et al.) may be used, as well as other liquid precursor bubblers. The source compound is maintained in the bubbler as a liquid or solid. Solid source compounds are typically vaporized or sublimed prior to transportation to the deposition chamber. Bubblers for use with ALD processes may have pneumatic valves at the inlet and outlet ports to facility opening and closing as required to provide the necessary vapor pulses.

In conventional CVD processes, a bubbler for supplying a liquid precursor, as well as certain bubblers for supplying solid precursors, will contain a dip tube which is connected to the gas inlet port. In general, the carrier gas is introduced below the surface of the organometallic compound, also called a precursor or source compound, and travels upward through the source compound to the headspace above it, entraining or carrying vapor of the source compound in the carrier gas.

Precursors used, in ALD processes are often liquids, low melting solids, or solids formulated in a solvent. To handle these types of precursors, bubblers used in ALD processes may contain a dip tube connected to the outlet port. Gas enters these bubblers through the inlet, pressurizes the bubbler and forces the precursor up the dip tube and out of the bubbler.

The present invention provides a delivery device including the organometallic compound described above. In one embodiment, the delivery device includes a vessel having a generally cylindrical shaped portion having an inner surface having a cross-section, a top closure portion and a bottom closure portion, the top closure portion having an inlet opening for the introduction of a carrier gas and an outlet opening, the generally cylindrical shaped portion having a chamber containing the organometallic compound described above.

The deposition reactor contains a chamber which is typically a heated vessel within which is disposed at least one, and possibly many, substrates. The deposition chamber has an outlet, which is typically connected to a vacuum pump in order to draw by-products out of the chamber and to provide a reduced pressure where that is appropriate. MOCVD or ALD can be conducted at atmospheric or reduced pressure ranging from 40 Pa to 101 kPa (0.3 Ton to 760 Torr). The deposition chamber is maintained at a temperature sufficiently high to induce decomposition of the source compound. The typical deposition chamber temperature is from 150° to 600° C., more typically from 150° to 400° C., the exact temperature selected being optimized to provide efficient deposition. Optionally, the temperature in the deposition chamber as a whole can be reduced if the substrate is maintained at an elevated temperature, or if other energy such as plasma is generated by a radio frequency source.

Deposition is continued for as long as desired to produce a metal-containing film having the desired properties. Typically, the film thickness will be from ten to several thousand angstroms or more when deposition is stopped. Exemplary metal-containing films include metal films, metal nitride films, metal oxide films, and metal carbide films.

An ALD apparatus typically includes a vacuum chamber means to provide an evacuated atmosphere, a pair of means situated in the vacuum chamber means, the pair of means including a support means for supporting at least one substrate and a source means for forming sources for as least two vapors of two different precursors, respectively, and operating means operatively connected with one of the pair of means for operating the one means with respect to the other of the pair of means for providing on the substrate first a single atomic layer of one of the precursors and then a single atomic layer of the other precursor. See, for example, U.S. Pat. No. 4,058,430 (Suntola) for a description of an exemplary ALD apparatus.

When the present organometallic compounds are to be used in ALD processes or in direct liquid injection processes, they may be combined with an organic solvent. Any organic solvent which is both soluble and suitably inert to the organometallic compound, as well as match the vapor pressure, thermal stability, and polarity of the organometallic compound can be employed. Exemplary organic solvents include, without limitation, aliphatic hydrocarbons, aromatic hydrocarbons, linear alkyl benzenes, halogenated hydrocarbons, silyated hydrocarbons, alcohols, ethers, glymes, glycols, aldehydes, ketones, carboxylic acids, sulphonic acids, phenols, esters, amines, alkylnitrile, thioethers, thioamines, cyanates, isocyanates, thiocyanates, silicone oils, nitroalkyl, alkylnitrate, and mixtures thereof. Suitable solvents include tetrahydrofuran, diglyme, n-butyl acetate, octane, 2-methoxyethyl acetate, ethyl lactate, 1,4-dioxane, vinyltrimethylsilane, pyridine, pentamethyldiethylenetriamine, mesitylene, toluene, xylene, diethylbenzene, cyclohexylbenzene, bicyclohexyl, linear ($C_{14}$-$C_{30}$) alkylaromatic compounds (linear alkyl benzenes or "LAB"), diphenyl ether, biphenyl, 1,2,3,4-tetrahydronaphthalene, ethylene glycol dibutyl ethers (butyl glymes), and polyethylene glycol dibutyl ether. Mixtures of organic solvents may be used. When used in direct liquid injection processes, the concentration of the organometallic compound is typically in the range of 0.01 to 1.5M, and more typically 0.01 to 0.15M. The organometallic compound/organic solvent compositions may be in the form of solutions, slurries or dispersions.

Compositions including the present organometallic compound and an organic solvent are suitable for use in vapor deposition processes employing direct liquid injection. Suitable direct liquid injection processes are those described in U.S. Patent Application No. 2006/0110930 (Senzaki).

Further provided by the present invention is a method for manufacturing an electronic device including the step of depositing a metal-containing film using any one of the above described methods.

The present organometallic compounds, which may be homoleptic or heteroleptic, are particularly suitable for use in any suitable vapor deposition process, including CVD and ALD. These organometallic compounds have a desirable balance of functionality, thermal stability and surface reactivity, higher solubility in organic solvents, longer shelf-life and reduced safety issues than the corresponding nitrogen-containing organometallic compounds where the ligand has a metal-nitrogen bond or phosphorus-containing organometallic compounds where the ligand has a metal-phosphorus bond. The present organometallic compounds and methods provide metal-containing thin films that exhibit reduced carbon and other organic incorporation, that are free of deposits, particles, and surface defects such as roughness and compositional non-uniformity, as compared to the corresponding organometallic compounds that contain a metal-nitrogen or metal-phosphorus bond.

EXAMPLE 1

(A) N,N'-di-tert-butyl acetamidine was synthesized as follows. Anhydrous $FeCl_3$ (1.04 mol.) was suspended in 1 L of $CH_2Cl_2$ under $N_2$ at room temperature. The suspension was cooled to −40 to −50° C. and acetonitrile (1 mol) was quickly added with stirring. While the solution was cooled below −70° C., tert-butyl chloride (1.04 mol) was added, followed by tert-butylamine (1.05 mol). The solution was then left stirring at −70° C. for a few hours and then warmed up to −20° C., followed by pouring it into a diluted aqueous NaOH solution (12.5 wt %, 1 L). Additional water was added to ensure complete formation of precipitate. The organic layer was separated and the aqueous phase was then extracted with fresh $CH_2Cl_2$. Combined $CH_2Cl_2$ fractions were washed twice with water and dried over anhydrous $MgSO_4$. The dried organic solution was evaporated to yield a light yellow liquid. The crude amidine thus obtained was then purified by fractional distillation. Yield of the main fraction was >70%, and free of organic and metallic impurities as detected by $^1H$ NMR and ICP-MS. $^1H$ NMR (in $C_6D_6$, δ ppm): 3.02 (br. s, 1H), 1.41 (s, 3H), δ 1.34 (s, 18H).

(B) Lithium N,N'-di-tert-butyl acetamidinate was synthesized as follows. A n-butyl lithium solution in hexanes (2.5 M, 400 mL) was added in a dropwise manner into N,N'-di-tert-butyl acetamidine (1 mol) dissolved into diethyl ether (1.5 L) at −78° C. under $N_2$. After the addition, the resulting mixture was allowed to warm up to room temperature, and was then stirred overnight. Next, all volatile solvents were stripped to dryness under reduced pressure, yielding an off white solid material. It was used directly for next step.

(C) N,N'-di-tert-butylacetamidinato-N,N'-di-tert-butylacetamidinatocarbamoyl dicarbonyl Ruthenium(II) ("Ru(AMD)-Cbm") was synthesized as follows. To the reaction flask containing the lithium amidinate (1 mol), 3 L of anhydrous THF was added, followed by $RuCl_2(CO)_3(THF)$ in stoichiometric quantities yielding an orange-reddish solution. The reaction was then stirred at room temperature overnight. Next, all solvent was stripped to dryness, and the product was then extracted with anhydrous hexanes. All hexane extractions were combined, and stripped to dryness yielding an orange material which was further purified by recrystallization from hexane. The resulting product was analyzed by $^1H$ NMR spectroscopy and TGA analysis.

EXAMPLE 2

The decomposition temperature of N,N'-di-tert-butylacetamidinato-N,N'-di-tert-butylacetamidinatocarbamoyl dicarbonyl Ruthenium(II) ("Ru(AMD)-Cbm") was determined using accelerated rate calorimetry (ARC™ adiabatic calorimeter available from Arthur D. Little). A sample of the compound was placed in a spherical bomb that was connected to a sealed pressure measurement system. A thermocouple was attached to the outside of the bomb and the bomb was placed in the center of the calorimeter assembly. The calorimeter assembly has 3 zones, each zone having its own thermocouple and heaters. The ARC™ calorimeter uses a heat-wait-search-exotherm program. The calorimeter and the sample were heated to a start temperature. The sample and calorimeter temperatures equilibrated during the wait portion of the program. Next, the calorimeter monitored the sample for self-heating (exceeding 0.02° C./minute) during the search portion of the program to determine the onset temperature of the exotherm. To be useful in ALD processes, a precursor should not decompose at temperatures at or below 140° C., and preferably not at or below 150° C. The sample was found to be stable up to 250° C., which makes the compound useful for ALD.

EXAMPLE 3

The vaporization rates for both a conventional ruthenium amidinate compound (bis(N,N'-di-tert-butylacetamidinato) dicarbonyl Ruthenium(II)) and a ruthenium carbamoyl compound of the present invention (N,N'-di-tert-butylacetamidinato-N,N'-di-tert-butylacetamidinatocarbamoyl dicarbonyl Ruthenium(II)) were determined using thermogravimetric analyses ("TGA"). TGA data were obtained with a TA Q50 thermogravimetric analyzer (available from TA Instruments Company) inside a nitrogen glove box. The sample $N_2$ flow rate is 60 mL/min. Samples (10-20 mg) were loaded in open platinum crucibles. The measurements were done with a temperature ramp rate of 10° C./min. The TGA data show that the ruthenium carbamoyl compound of the present invention has a vaporization rate similar to that of the conventional ruthenium amidinate compound.

EXAMPLE 4

The solubility of N,N'-di-tert-butylacetamidinato-N,N'-di-tert-butylacetamidinatocarbamoyl dicarbonyl Ruthenium(II) ("Ru-Cbm-Invention", from Example 1) and bis(N,N'-di-tert-butylacetamidinato) dicarbonyl Ruthenium(II) ("Ru-AMD-Comparative") were determined at room temperature in a variety of solvents by direct dissolution method. The solid Ru-AMD-Comparative compound was prepared by the synthetic route described in R. Gordon et al., *The Open Inorganic Chemistry Journal*, 2 (2008) 11. The solubility data are shown in the Table 1. Compounds with less than 0.01 wt % dissolved were considered to be sparingly soluble. These data clearly demonstrate the greatly increased solubility of the carbamoyl compounds of the invention as compared to their corresponding nitrogen-containing compounds.

TABLE 1

| Sample | Solvent | Ru-AMD Solubility (wt %) | Ru-Cbm Solubility (wt %) |
| --- | --- | --- | --- |
| 4A | THF | 0.7 | 43.6 |
| 4B | Toluene | <0.01 | 38.5 |
| 4C | Tetralin | <0.01 | 8.5 |
| 4D | Cyclohexylbenzene | <0.01 | 6.0 |
| 4E | Cyclohexylbenzene:LAB (1:1) | <0.01 | 6.0 |
| 4F | n-Octane | insoluble | 2.3 |
| 4G | Pentamethyldiethylenetriamine | <0.01 | 15.0 |
| 4H | Mixture of Diphenyl ether and Biphenyl | <0.01 | 12.0 |
| 4I | Polyethylene glycol dibutyl ether | <0.01 | 8.0 |
| 4J | LAB | <0.01 | 3.0 |

EXAMPLE 5

N,N'-di-tert-butylformamidinato-N,N'-di-tert-butylformamidinatocarbamoyl dicarbonyl Ruthenium(II) ("Ru (fAMD)-Cbm') is expected to be synthesized using the procedures of Example 1 (C), and employing lithium N,N'-di-tert-butylformamidinate.

EXAMPLE 6

N,N'-di-tert-butylacetamidinatocarbamoyl methylcyclopentadienyl monocarbonyl Ruthenium(II) ("Ru(Cp$^{Me}$)-Cbm") is expected to be synthesized as follows. To a reaction flask containing lithium methylcyclopentadienyl, a desirable amount of anhydrous THF is added, followed by RuCl$_2$(CO)$_3$(THF) in stoichiometric quantities. After that, a THF solution of lithium di-tert-butylacetamidinate is added in dropwise manner. The reaction mixture is then stirred at room temperature overnight. Next, all solvent is stripped to dryness, and the reaction product is extracted with anhydrous hexanes. All hexane extractions are combined, and stripped to dryness and the resulting product is expected to be further purified by recrystallization from hexane.

EXAMPLE 7

N,N'-di-tert-butylformamidinatocarbamoyl tetracarbonyl Manganese(I) ("Mn-fCbm") is expected to be synthesized as follows. To a reaction flask containing lithium N,N'-di-tert-butylformamidinate, a desirable amount of anhydrous THF is added, followed by Mn(CO)$_5$Cl in stoichiometric quantities. The reaction mixture is then stirred at room temperature overnight. Next, all solvent is stripped to dryness, and the reaction product is then to be extracted with anhydrous hexanes. All hexane extractions are combined, and stripped to dryness and the resulting product is expected to be further purified by recrystallization from hexane.

EXAMPLE 8

N,N'-di-tert-butylformamidinatocarbamoyl methylcyclopentadienyl monocarbonyl iron(II) ("Fe(Cp$^{Me}$)-fCbm") is expected to be synthesized as follows. To a reaction flask containing methylcyclopentadienyl dicarbonyl iron(II) chloride (Cp$^{Me}$Fe(CO)$_2$Cl) dissolved into a suitable amount of anhydrous THF, a solution of 1 mol. equivalent of lithium di-tert-butylformamidinate in THF is added in dropwise manner at room temperature. The reaction mixture is then stirred at room temperature overnight. Next, all solvent is stripped to dryness, and the reaction product is extracted with anhydrous hexanes. All hexane extracts are combined, and the solvent is completely removed to afford the crude product, which will be purified further by recrystallization from hexane.

EXAMPLE 9

The compositions in the following Table 2 are produced using one or more of the procedures described above. The starting materials and procedures are provided in the table. The compositions contain one carbonyl-containing ligand of the invention along with anionic ligands as necessary to fulfill the metal valance requirements. In the table, Cbm-1, Cbm-5, and Cbm-6 represent the carbonyl-containing moieties from Examples 1, 5, and 6, respectively.

TABLE 2

| Sample | Metal (valance) | Carbonyl-containing Ligand | L$^1$ | L$^2$ | Procedure |
|---|---|---|---|---|---|
| 9A | Fe (II) | Cbm-1 | MeCp | CO | Example 1 |
| 9B | Rh (II) | Cbm-5 | EtCp | 1,3-butadiene | Example 5 |
| 9C | Os (II) | Cbm-6 | bdk | 1,5-hexatriene | Example 6 |
| 9D | Ir (II) | Cbm-1 | t-Bu$_2$-AMD | NO | Example 1 |
| 9E | Ru (II) | i-Pr$_2$-AMD(CO) | i-Pr$_2$-AMD | CO | Example 1 |
| 9F | Ru (II) | Bz$_2$-AMD(CO) | Bz$_2$-AMD | TBP | Example 2 |
| 9G | Ru (II) | i-Pr$_2$N(CO) | none | CO | Example 1 |
| 9H | Ru (II) | EtMeN(CO) | Et$_2$-FAMD | 1,4-cyclohexadiene | Example 1 |
| 9I | Ru (II) | Bz$_2$P(CO) | none | CO | Example 5 |
| 9J | Rh (II) | Bz$_2$-AMD(CO) | Bz$_2$-AMD | CO | Example 1 |
| 9K | Os (II) | Cbm-5 | mmp | 1,3-butadiene | Example 5 |
| 9L | Ir (II) | Cbm-1 | s-Bu$_2$-AMD | CO | Example 1 |
| 9M | Ru (II) | Cbm-5 | t-Bu—Et—Et-AMD | CO | Example 5 |
| 9N | Fe (II) | Cbm-5 | Me$_2$-AMD | CO | Example 5 |
| 9O | Rh (II) | Cbm-6 | iPrCp, bdki | CO | Example 6 |

The abbreviations in the above table have the following meanings: acac=acetonylacetonate; bdk=beta diketonate; bdki=beta diketominate; EtMeN=ethylmethylamino; Et$_2$-FAMD=diethylformamidinato; s-Bu$_2$-AMD=di-sec-butylamidinato; t-Bu$_2$-AMD=di-tert-butylamidinato; t-Bu$_2$-FAMD=di-tert-butylformamidinato; Bz$_2$-AMD=dibenzylacetamidinato; i-Pr$_2$-AMD(CO)=di-isopropylacetamidinatocarbamoyl; Bz$_2$-AMD(CO)=dibenzylacetamidinatocarbamoyl; i-Pr$_2$N(CO)=di-iso-propylaminocarbamoyl; EtMeN(CO)=ethylmethylaminocarbamoyl; Bz$_2$P(CO)=dibenzylphosphidocarbamoyl; MeCp=methylcyclopentadienide; Me$_5$Cp=pentamethylcyclopentadienide; i-PrCp=iso-propylcyclopentadienide; TBP=tris(tert-butyl)phosphine; and mmp=methoxy methyl propoxide.

EXAMPLE 10

Compositions suitable for use in ALD or DLI processes are prepared by combining a carbonyl-containing compound of the invention with one or more organic solvents as set forth in Table 3 below. The carbonyl-containing compounds are typically present in a concentration of 0.1-0.2 M.

TABLE 3

| Sample | Carbonyl-containing Compound | Solvent |
|---|---|---|
| 10A | Example 1 | THF, alkyl benzene |
| 10B | Example 1 | 1,4-Dioxane |
| 10C | Example 1 | n-Butyl acetate |

TABLE 3-continued

| Sample | Carbonyl-containing Compound | Solvent |
|---|---|---|
| 10D | Example 5 | Octane, alkyl benzene |
| 10E | Example 5 | Diglyme |
| 10F | Example 6 | Octane |
| 10G | Example 6 | Tetraglyme |
| 10H | Example 6 | 2-Methoxyethoxy acetate |
| 10I | Example 9F | LAB |
| 10J | Example 9G | Polyglyme |
| 10K | Example 9H | Octane, alkyl benzene |
| 10L | Example 9I | Tetralene |
| 10M | Example 9M | Pentamethyldiethylenetriamine (PMDETA) |

EXAMPLE 11

Ruthenium films are grown using the N,N'-di-tert-butylacetamidinato-N,N'-di-tert-butylacetamidinatocarbamoyl dicarbonyl ruthenium(II) ("Ru(AMD)-Cbm") from Example 1. Ru(AMD)-Cbm (1 g) is placed into a source boat from an ASM F-120 ALD reactor under $N_2$. The source temperature is set at 140° C. Ammonia is used as the second precursor to affect the atomic layer deposition of ruthenium films. The primary and secondary purging gases are $N_2$, and their flow rates are set at 400 and 300 sccm, respectively. A 10 cm (4 inch) diameter wafer of p-type silicon (Cz, single side polished) is placed in the ALD chamber and heated at 300° C. The pulse sequence is adjusted as follows: precursor/$N_2$ purge at 1 s/3 s, while the ammonia flow from a high purity ammonia source is kept on at 40 sccm during the deposition. 1000 Cycles are applied for the Ru thin film deposition.

A smooth, highly uniform Ru film is expected to be grown on the wafer after 1000 cycles. The film thickness is expected to be more than 125 nm, thereby affording the un-optimized thin film growth rate of about 1.25 Å/cycle.

EXAMPLE 12

Ruthenium films were grown using a solution of ruthenium carbamoyl precursor from Example 1 in a solvent using a DLI system. The solvent was purified by distillation from calcium hydride under inert nitrogen gas atmosphere. The freshly distilled solvent was used for preparing the diluted solution of ruthenium carbamoyl precursor, N,N'-di-tert-butylacetamidinato-N,N'-di-tert-butylacetamidinatocarbamoyl dicarbonyl Ruthenium(II). Suitable solvents were chosen from THF, toluene, a mixture of cyclohexylbenzene and bicyclohexyl (9:1, v/v), 1,2,3,4-tetrahydronaphthalene, or diethylbenzene. In one experiment, the concentration of the ruthenium carbamoyl precursor was 0.08 M in a mixture of cyclohexylbenzene and bicyclohexyl (9:1, v/v). The solution was filtered in order to ensure particle-free environment. The solution was then transported from its container to a vaporizer unit of the DLI system. The vaporization temperature was set at 100° C. to 160° C. Ammonia was used as a second reactant to deposit metallic ruthenium films. In some deposition runs, $O_2$ at low concentrations in $N_2$ (0-30% v/v, preferably 1-10%) was used as the second reagent. The reactor was enabled for depositions in either of ALD, CVD, Pulse CVD, or AVD modes. The carrier and purging gases used were $N_2$ or argon or helium, and their flow rates ranged from 50 to 500 sccm, respectively. A 10 cm diameter wafer of p-type silicon (with 20 nm thermal oxide) was placed in the deposition chamber and heated at a temperature range of 250 to 325° C. As a result, smooth, highly uniform and conductive metallic Ru films were obtained.

EXAMPLE 13

Ruthenium films were grown using either the Ru(AMD)-Cbm of Example 1 or the Ru-AMD-Comparative compound of Example 4, in each case using the procedure of Example 12 except that the deposition temperature was 350° C. Lower sheet resistivities were achieved for the Ru films grown from the solution of the Ru(AMD)-Cbm from Example 1 as compared with Ru films using solid Ru-AMD-Comparative. The Ru film resistivities were found to be 200 μohm·cm and >500 μohm·cm, respectively, using a 4-point probe method. It can be seen that the Ru films grown from the compounds of the invention have resistivities that are 60% less than those grown using conventional Ru organometallic compounds.

What is claimed is:

1. A method of depositing a metal-containing film comprising: providing a substrate in a vapor deposition reactor; conveying an organometallic compound of the formula $[R^2R^1X(CO)]_nM^{+m}L^1_{(m-n)/p}L^2_q$ in the vapor phase to the reactor; and decomposing the organometallic compound to deposit a metal-containing film on the substrate; wherein $R^1$ and $R^2$ are independently chosen from H, $(C_1-C_{12})$alkyl, $(C_2-C_{12})$alkenyl, $(C_2-C_{12})$alkynyl, di$(C_1-C_{12})$alkylamino, di(silyl $(C_1-C_{12})$alkyl)amino, disilylamino, di$((C_1-C_{12})$alkylsilyl)amino, $(C_1-C_{12})$alkyliminyl, $(C_1-C_{12})$alkylphosphinyl, di$(C_1-C_{12})$alkylamino$(C_1-C_{12})$alkyl, di$(C_1-C_{12})$alkylamino$(C_2-C_{12})$alkenyl, di$(C_1-C_{12})$alkylamino$(C_2-C_{12})$alkynyl, di$(C_1-C_{12})$alkylphosphino$(C_1-C_{12})$alkyl, di$(C_1-C_{12})$alkylphosphino$(C_2-C_{12})$alkenyl, di$(C_1-C_{12})$alkylphosphino$(C_2-C_{12})$alkynyl, $(C_1-C_{12})$alkoxyl$(C_1-C_{12})$alkyl, and aryl; X=N or P; M=a Group 7 to Group 10 metal; $L^1$=an anionic ligand bearing a negative charge of p; $L^2$=a neutral ligand; m=the valence of M; n=1-6; p=1-2; q=0-4; and wherein m≧n.

2. The method of claim 1 wherein the organometallic compound has the formula

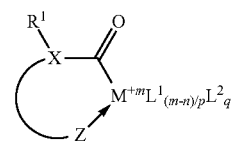

wherein Z is chosen from $OR^3$, $NR^3R^4$ and $PR^3R^4$, and each of $R^3$ and $R^4$ are independently selected from hydrogen and $(C_1-C_{12})$alkyl.

3. The method of claim 1 wherein the $(C_1-C_{12})$alkyliminyl and $(C_1-C_{12})$alkylphosphinyl groups are selected from amidinates, formamidinates, phosphoamidinates, guanidinates, β-diketiminates, bicyclic amidinates and bicyclic guanidinates.

4. The method of claim 1 wherein $L^1$ is selected from hydride, halide, azide, alkyl, alkenyl, alkynyl, carbonyl, amino, alkylamino, dialkylamino, di(silylalkyl)amino, disilylamino, di(alkylsilyl)amino, dialkylaminoalkyl, hydrazido, phosphido, nitrosyl, nitryl, nitrate, nitrile, alkoxy, dialkylaminoalkoxy, alkoxyalkyldialkylamino, siloxy, diketonates, cyclopentadienyls, silyls, pyrazolates, amidinate, formamidinate, phosphoamidinate, guanidinates, β-diketonates, β-diketiminates, bicyclic amidinates, bicyclic guanidinates and bidentate ligands having at least two coordination sites chosen from N and O.

5. The method of claim 1 wherein M is chosen from a Group 8 to Group 10 metal.

6. The method of claim 1 wherein M is chosen from Mn, Tc, Re, Fe, Ru, Os, Co, Rh, Ir, Ni, Pd, and Pt.

7. The method of claim 1 further comprising the step of providing the organometallic compound in an organic solvent prior to the step of conveying the organometallic compound in the vapor phase to the reactor.

8. A method of depositing a metal-containing film on a substrate comprising the steps of: (a) providing a substrate in a reactor; (b) conveying a first precursor compound in a gaseous form to the reactor, wherein the first precursor compound is an organometallic compound of the formula $[R^2R^1X(CO)]_nM^{+m}L^1_{(m-n)/p}L^2_q$ wherein $R^1$ and $R^2$ are independently chosen from H, $(C_1-C_{12})$alkyl, $(C_2-C_{12})$alkenyl, $(C_2-C_{12})$alkynyl, di$(C_1-C_{12})$alkylamino, di(silyl$(C_1-C_{12})$alkyl)amino, disilylamino, di$((C_1-C_{12})$alkylsilyl)amino, $(C_1-C_{12})$alkyliminyl, $(C_1-C_{12})$alkylphosphinyl, di$(C_1-C_{12})$alkylamino$(C_1-C_{12})$alkyl, di$(C_1-C_{12})$alkylamino$(C_2-C_{12})$alkenyl, di$(C_1-C_{12})$alkylamino$(C_2-C_{12})$alkynyl, di$(C_1-C_{12})$alkylphosphino$(C_1-C_{12})$alkyl, di$(C_1-C_{12})$alkylphosphino$(C_2-C_{12})$alkenyl, di$(C_1-C_{12})$alkylphosphino$(C_2-C_{12})$alkynyl, $(C_1-C_{12})$alkoxyl$(C_1-C_{12})$alkyl, and aryl; X=N or P; M=a Group 7 to Group 10 metal; $L^1$=an anionic ligand bearing a negative charge of p; $L^2$=a neutral ligand; m=the valence of M; n=1-6; p=1-2; q=0-4; and wherein m≧n; (c) chemisorbing the first precursor compound on a surface of the substrate; (d) removing any non-chemisorbed first precursor compound from the reactor; (e) conveying a second precursor in a gaseous form to the reactor; (f) reacting the first and second precursors to form a metal-containing film on the substrate; and removing any unreacted second precursor.

9. The method of claim 8 further comprising the step of providing the organometallic compound in an organic solvent prior to the step (b).

10. The method of claim 9 wherein the organic solvent is chosen from aliphatic hydrocarbons, aromatic hydrocarbons, linear alkyl benzenes, halogenated hydrocarbons, silyated hydrocarbons, alcohols, ethers, glymes, glycols, aldehydes, ketones, carboxylic acids, sulphonic acids, phenols, esters, amines, alkylnitrile, thioethers, thioamines, cyanates, isocyanates, thiocyanates, silicone oils, nitroalkyl, alkylnitrate, and mixtures thereof.

11. An organometallic compound of the formula $[R^2R^1N(CO)]_nM^{+m}L^1_{(m-n)/p}L^2_q$; wherein $R^1$ and $R^2$ are independently chosen from H, $(C_1-C_{12})$alkyl, $(C_2-C_{12})$alkenyl, $(C_2-C_{12})$alkynyl, di$(C_1-C_{12})$alkylamino, di(silyl$(C_1-C_{12})$alkyl)amino, disilylamino, di$((C_1-C_{12})$alkylsilyl)amino, $(C_1-C_{12})$alkyliminyl, $(C_1-C_{12})$alkylphosphinyl, di$(C_1-C_{12})$alkylamino $(C_1-C_{12})$alkyl, di$(C_1-C_{12})$alkylamino$(C_2-C_{12})$alkenyl, di$(C_1-C_{12})$alkylamino$(C_2-C_{12})$alkynyl, di$(C_1-C_{12})$alkylphosphino$(C_1-C_{12})$alkyl, di$(C_1-C_{12})$alkylphosphino$(C_2-C_{12})$alkenyl, di$(C_1-C_{12})$alkylphosphino$(C_2-C_{12})$alkynyl, $(C_1-C_{12})$alkoxyl$(C_1-C_{12})$alkyl, and aryl; X=N or P; M=a Group 7 to Group 10 metal; $L^1$=an anionic ligand bearing a negative charge of p chosen from amidinates, formamidinates, phosphoamidinates, guanidinates, bicyclic amidinates, and bicyclic guanidinates; $L^2$=a neutral ligand; m=the valence of M; n=1-6; p=1-2; q=0-4; and wherein m≧n.

12. The organometallic compound of claim 11 wherein $L^1$ is chosen from: tetramethylguanidinates; tetraethylguanidinates; N,P-dimethyl-methylphosphoamidinato, N,P-diethyl-methylphosphoamidinato, N,P-diethyl-ethylphosphoamidinato, N,P-di-iso-propyl-methylphosphoamidinato, N,P-di-iso-propyl-iso-propylphosphoamidinato, and N,P-dimethyl-phenylphosphoamidinato.

13. The organometallic compound of claim 11 wherein the compound is chosen from: N,N'-di-tert-butylacetamidinato-N,N'-di-tert-butylacetamidinatocarbamoyl dicarbonyl Ruthenium(II); N,N'-di-tert-butylformamidinato-N,N'-di-tert-butylformamidinatocarbamoyl dicarbonyl Ruthenium (II); N,N'-di-tert-butylacetamidinatocarbamoyl methylcyclopentadienyl monocarbonyl Ruthenium(II); N,N'-di-tert-butylformamidinatocarbamoyl tetracarbonyl Manganese(I); and N,N'-di-tert-butylformamidinatocarbamoyl methylcyclopentadienyl monocarbonyl iron(II).

14. An organometallic compound of the formula $[R^2R^1P(CO)]_nM^{+m}L^1_{(m-n)/p}L^2_q$; wherein $R^1$ and $R^2$ are independently chosen from H, $(C_1-C_{12})$alkyl, $(C_2-C_{12})$alkenyl, $(C_2-C_{12})$alkynyl, di$(C_1-C_{12})$alkylamino, di(silyl$(C_1-C_{12})$alkyl) amino, disilylamino, di$((C_1-C_{12})$alkylsilyl)amino, $(C_1-C_{12})$alkyliminyl, $(C_1-C_{12})$alkylphosphinyl, di$(C_1-C_{12})$alkylamino $(C_1-C_{12})$alkyl, di$(C_1-C_{12})$alkylamino$(C_2-C_{12})$alkenyl, di$(C_1-C_{12})$alkylamino$(C_2-C_{12})$alkynyl, di$(C_1-C_{12})$alkylphosphino$(C_1-C_{12})$alkyl, di$(C_1-C_{12})$alkylphosphino $(C_2-C_{12})$alkenyl, di$(C_1-C_{12})$alkylphosphino$(C_2-C_{12})$alkynyl, $(C_1-C_{12})$alkoxyl$(C_1-C_{12})$alkyl, and aryl; M=a Group 7 to Group 10 metal; $L^1$=an anionic ligand bearing a negative charge of p; $L^2$=a neutral ligand; m=the valence of M; n=1-6; p=1-2; q=0-4; and wherein m≧n.

* * * * *